United States Patent [19]

Saburo et al.

[11] Patent Number: 4,472,688
[45] Date of Patent: Sep. 18, 1984

[54] AMPLIFIER CIRCUIT

[75] Inventors: Funada Saburo, Hamura; Tatsuhiko Okuma; Kazumasa Sakai, both of Tokyo, all of Japan

[73] Assignee: Trio Kabushiki Kaisha, Tokyo, Japan

[21] Appl. No.: 386,622

[22] Filed: Jun. 9, 1982

[51] Int. Cl.³ ............................. H03F 3/04; H03F 3/26
[52] U.S. Cl. ................................... 330/297; 330/273
[58] Field of Search ....................... 330/297, 262, 273

[56] References Cited
FOREIGN PATENT DOCUMENTS
157459 12/1979 Japan ................................... 330/297

Primary Examiner—James B. Mullins
Assistant Examiner—G. Wan
Attorney, Agent, or Firm—Gerald J. Ferguson, Jr.; Joseph J. Baker

[57] ABSTRACT

A voltage switching amplifier circuit has a comparator which, after comparing signal amplitude to a comparison voltage, switches on a high voltage or low voltage amplifier depending upon whether the comparison voltage is exceeded or not. After the predetermined comparison voltage is exceeded, a positive feedback circuit reduces the comparison voltage enabling the high voltage amplifier to continue operation at least until the signal amplitude drops below the reduced comparison voltage. In a preferred embodiment, a time constant circuit maintains the high voltage amplifier in operation for a predetermined period of time during which the signal amplitude has dropped below and remained below the reduced comparison voltage.

4 Claims, 4 Drawing Figures

AMPLIFIER CIRCUIT

BACKGROUND OF THE INVENTION

The present invention relates generally to amplifier circuits and specifically to a voltage switching amplifier with reduced distortion.

Amplifier circuits with a voltage-switching system that obtain higher efficiency than a class-B power amplifier circuit are known and an example of a push-pull amplifier circuit is shown in FIG. 1. It is comprised of an output transistor 1 (1') (components relating to the positive signals are unprimed and components relating to the negative signals are primed and generally in parenthesis) that is connected to a low-voltage power source $+V_L$ ($-V_L$) and drives the load. Another output transistor 2 (2') that is connected to a high-voltage power source $+V_H$ ($-V_H$) also drives the load. A comparator, which is not shown in the diagram, compares the input signal voltage with the preset switching voltage (noted as comparison voltage hereafter). A switching device 3 (3') that turns ON with the output of the comparator when the input signal voltage is lower than the comparison voltage conducts the input signal to the output transistor 1 (1'). A switching device 4 (4') that turns ON with the output of the comparator when the input voltage exceeds the comparison voltage conducts the input signal to the output transistor 2 (2'). Input driver circuit 5 supplies the input signal $V_i$.

When a conventional amplifier circuit with a voltage-switching system configured as in FIG. 1 is used, the output transistor is switched by the magnitude of the input signal voltage, allowing a higher efficiency, as shown by curve a in FIG. 2, than the efficiency of a conventional class-B power amplifier circuit as shown by curve b in FIG. 2.

However, when the above-mentioned conventional amplifier circuit is used, switching distortion occurs in switching from the output transistor connected to the low voltage power source to the output transistor connected to the high voltage power source, resulting in signal distortion. Furthermore, although the distortion factor does not deteriorate too much at low frequency because of the availability of sufficient negative feedback, a shortcoming exists at high frequency when the amount of negative feedback is reduced due to phase compensation, etc. making it difficult to improve the distortion factor.

SUMMARY OF THE INVENTION

It is therefore an object of the present invention to provide a voltage-switching amplifier having a low distortion factor while retaining higher efficiency than a class-B power amplifier.

It is a further object of the present invention to reduce high frequency distortion in a voltage-switching amplifier.

The above and other objects are achieved by electrically providing a hysteresis effect in the comparison stage of the voltage switching amplifier such that the comparison voltage changes when the high voltage amplifier begins amplification. Specifically, a feedback circuit decreases the comparison voltage when the higher voltage amplifier turns ON such that it will remain ON until the input voltage drops below the reduced comparison voltage. Additionally in a preferred embodiment, a time constant circuit prevents momentary input signal fluctuations below the reduced comparison voltage from turning the high voltage amplifier OFF.

BRIEF DESCRIPTION OF THE DRAWINGS

A more complete appreciation of the invention, and many of the attendant advantages thereof, will be readily apparent by reference to the accompanying drawings, wherein.

DETAILED DESCRIPTION OF PREFERRED EMBODIMENTS

Figure 3:
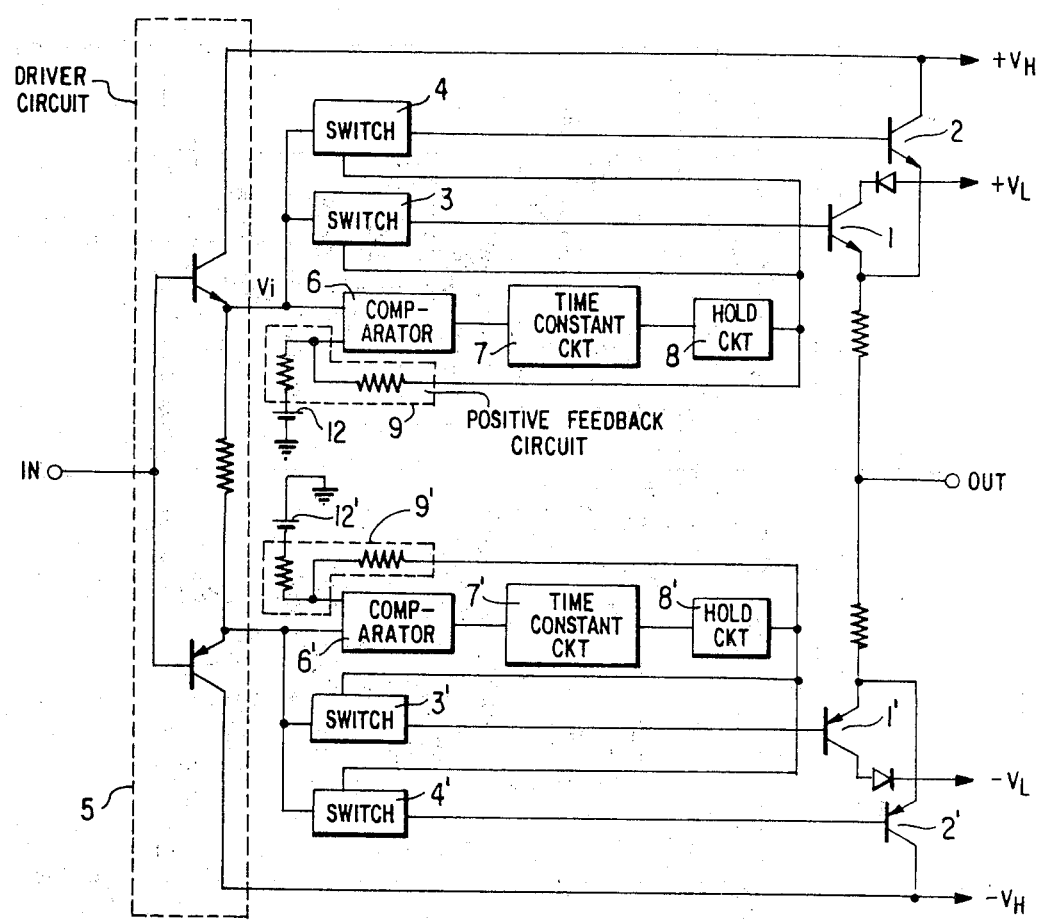
FIG. 3 is an electronic circuit diagram of a push-pull voltage switching amplifier in accordance with the present invention.

Referring now more particularly to the drawings wherein like reference numerals represent like elements throughout the several views, in FIG. 3 the input signal voltage is amplified by driver circuit 5 (noted simply as input signal voltage $V_i$ hereafter). This is impressed on output transistor 1 connected to the low voltage power source $+V_L$, and output transistor 2 connected to the high voltage power source $+V_H$, respectively through switching devices 3 and 4. The circuit is configured such that the input signal voltage $V_i$ is compared in the comparator 6 with the comparison voltage of the power source 12, changing the switching device 3 to the conduction state when the input signal voltage $V_i$ is below the voltage of the power source 12, and changing the switching device 4 to the conduction state when the input signal voltage $V_i$ exceeds the voltage of power source 12.

In this embodiment, a time constant circuit 7 and a holding circuit 8 are connected between comparator 6 and switching devices 3 and 4 in order to maintain the conduction of switching device 4 for a fixed time from the moment when the input signal voltage $V_i$ last exceeds the voltage of power source 12. At the same time, a positive feedback circuit 9 is connected to permit positive feedback of the output voltage of holding circuit 8 to the comparison voltage input terminal of comparator 6 to lower the comparison voltage of comparator 6 to a voltage lower than the power source 12 voltage providing comparator 6 with the desirable hysteresis characteristic.

The above explanation concerns only the parts in FIG. 3 that operate during the time when the signal at the input terminal IN is positive. However, the configuration is the same regarding the components that operate in the negative portion of the signal, and they are shown by the same notation with primes for each corresponding component in FIG. 3. As for the operation, the interaction of the components that operate in the negative portion of the signal is the same as the interaction of the components that operate in the positive portion.

Figure 1:
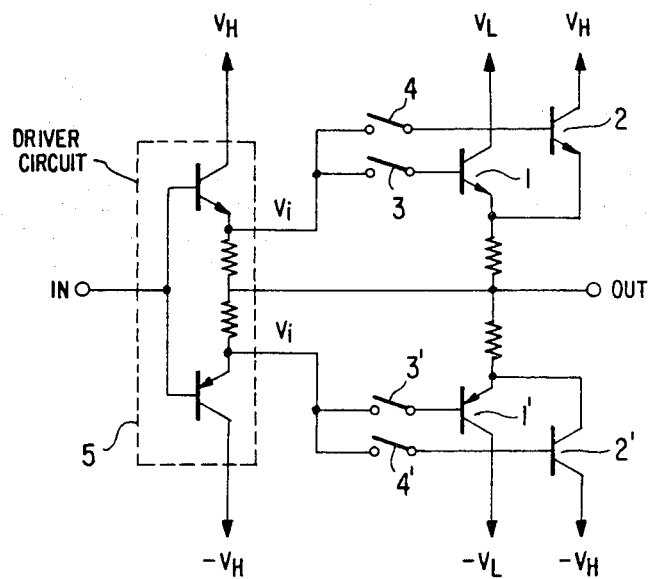
FIG. 1 is an electronic circuit diagram of a prior art push-pull voltage switching amplifier.

In this preferred embodiment, the operation of the push-pull amplifier is the same as in the case of FIG. 1 with the exception of time constant circuit 7, holding circuit 8, and positive feedback circuit 9. Thus, when the input signal voltage $V_i$ is less than the voltage of power source 12, switching device 3 turns ON due to comparator 6, and the load is driven by output transistor 1. If the output voltage $V_o$ is set as $V_o = E_m \sin\theta$, the efficiency in this case can be expressed by $$\frac{\pi E_m}{4 V_L}.$$

And, when the input signal voltage $V_i$ exceeds the voltage of power source 12, the load is driven by output transistor 2, and the efficiency in this case is as follows:

$$\frac{\pi E}{4\left[V_H \sqrt{1 + \left(\frac{V_L}{E_m}\right)^2} + V_L\left(1 - \sqrt{1 - \left(\frac{V_L}{E_m}\right)^2}\right)\right]}$$

Figure 2:
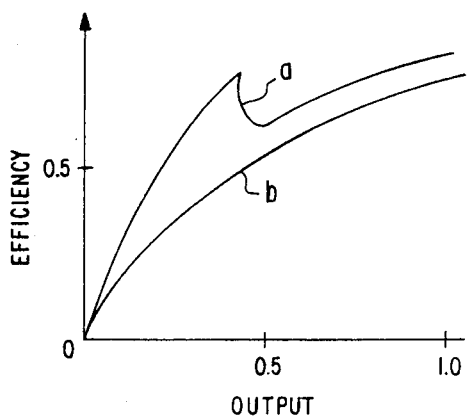
FIG. 2 is a graph comparing the efficiency versus output of the circuit in FIG. 1 with a conventional class-B power amplifier.

Therefore, the efficiency is as shown in curve a in FIG. 2, which is higher than the efficiency of a conventional class-B amplifier circuit.

However, as a result of the installation of time constant circuit 7 and holding circuit 8 in the FIG. 3 embodiment, switching device 4 is maintained ON for a fixed time, determined by the time constant of circuit 7, when the peak value of the input signal voltage $V_i$ exceeds the voltage of power source 12 as the comparison voltage.

Consequently, in the case of high frequency signals, when the input signal voltage $V_i$ is a larger, continuous signal than the voltage of power source 12, switching device 4 is maintained ON, switching device 3 stays OFF, and output transistor 2 operates to drive the load. In this state, the operation is the same as in a normal class-B amplifier circuit but with an improved distortion factor.

However, if only time constant circuit 7 and holding circuit 8 are provided (and positive feedback circuit 9 is eliminated), in the case when a ripple component is superimposed on the comparison voltage as an input signal and the peak value of the input signal and the comparison voltage are similar, the output of comparator 6 fluctuates between the ON and OFF states. This fluctuation is caused by the above-mentioned ripple component and the magnitude of the input signal voltage $V_i$ cannot be distinguished with a resultant deterioration of the distortion factor. However, if the positive feedback circuit 9 is used in this embodiment, the apparent gain of comparator 6 becomes higher. At the same time, after the time constant circuit 7 and holding circuit 8 operate turning switching device 4 ON, the comparison voltage of comparator 6 drops due to the positive feedback circuit 9. Thus, the comparator 6 shows an effective hysteresis characteristic, and the holding circuit 8 operates until the peak value of the input signal voltage $V_i$ becomes lower than the lowered comparison voltage (a value lower than the power source 12 voltage). Consequently, the comparison voltages of comparator 6 are different depending upon whether the input signal voltage $V_i$ is increasing or is decreasing. In the former case, the comparison voltage is high and at the voltage value of power source 12; and in the latter case, it changes to a lower voltage than the voltage value of power source 12 due to the positive feedback circuit 9. Thus, the above-mentioned fluctuation of the output of comparator 6 is eliminated and the region with a deteriorated distortion factor disappears.

Then, the distortion factor found in the conventional amplifier circuit with a voltage switching system shown in FIG. 1 is improved, and favorable distortion factor characteristics that are practically the same as the distortion factor of an ordinary class-B amplifier circuit, are obtained. In the case of input signal voltage $V_i$ with a large amplitude high frequency component, output transistor 2 operates and with the same efficiency as in the case of a normal class-B amplifier circuit. However, in the case of actual musical signals, etc., the energy volume is reduced as the frequency becomes higher, and in the low frequency range, high efficiency characteristics similar to the case of a conventional amplifier with a voltage-switching system results. Therefore, the efficiency in the case of the amplifier of this embodiment, actually becomes approximately the efficiency value of the conventional amplifier circuit with a voltage-switching system shown in FIG. 1 but without the distortion factor deterioration.

Furthermore, in the above explanation, the voltage to be compared at comparator 6 was obtained from driver circuit 5. However, the voltage of the output terminal OUT may also be impressed on comparator 6 as the voltage to be compared at comparator 6 to achieve the same result.

Figure 4:
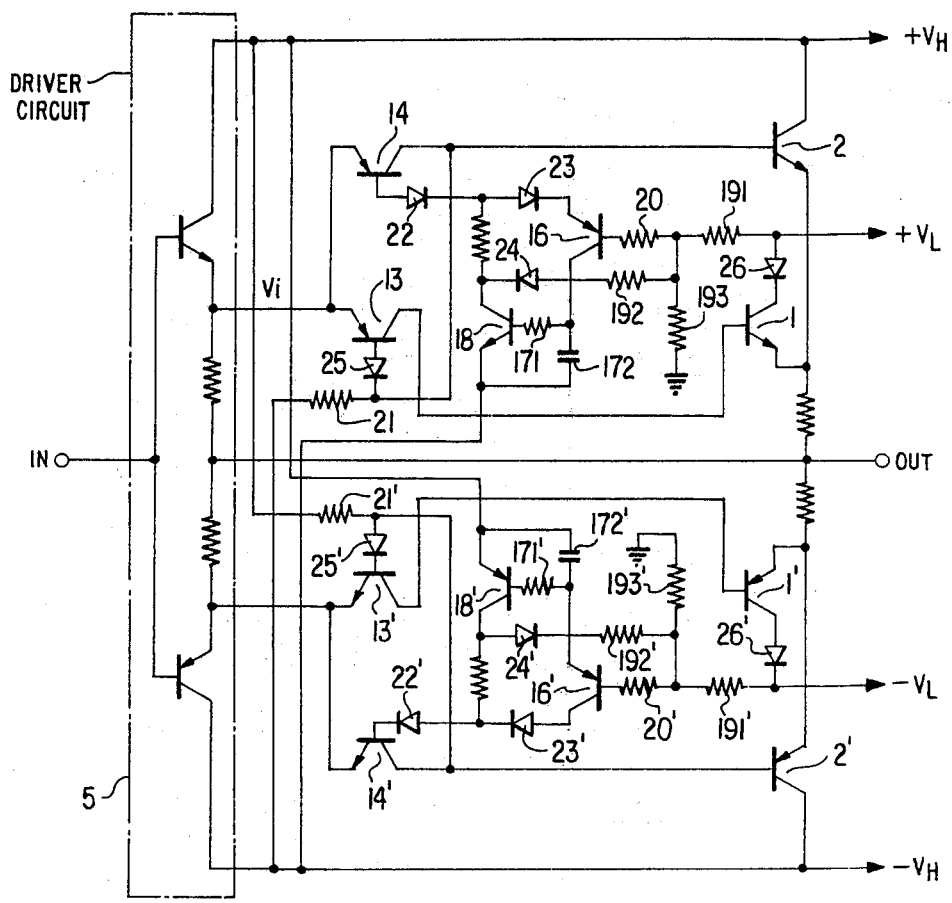
FIG. 4 is a further embodiment of a push-pull voltage switching amplifier in accordance with the present invention.

FIG. 4 is a circuit diagram of the specific circuit of one preferred embodiment of this invention. Transistor 13 (13') corresponds to switching device 3 (3'), and transistor 14 (14') corresponds to switching device 4 (4'). Transistor 16 (16') comprises comparator 6 (6'), and resistors 191 (191') and 193 (193') comprise a voltage divider circuit that divides the power source voltage $V_L (-V_L)$. The output voltage of this voltage divider circuit is impressed on the base of transistor 16 (16') across resistor 20 (20') to become the comparison voltage of comparator 6 (6') and corresponding to power source 12 (12'). Resistor 171 (171') and capacitor 172 (172') comprise the time constant circuit 7 (7'). Transistor 18 (18') comprises holding circuit 8 (8'), and resistor 192 (192') comprises the positive feedback circuit 9 (9') together with resistors 191 (191') and 193 (193').

The input signal voltage $V_i$ is connected so that it is led to output transistor 1 (1') through transistor 13 (13') with the base of transistor 13 (13') being connected to the high voltage power source $-V_H (+V_H)$ of an opposite polarity across resistor 21 (21'). The input signal voltage $V_i$ is also connected so that it is led to output transistor 2 (2') through transistor 14 (14') with the collector of transistor 14 (14') being connected to the base of transistor 13 (13'). Thus, when transistor 14 (14') is turned OFF, transistor 13 (13') always turns ON. When transistor 14 (14') is ON, the emitter-base junction of transistor 13 (13') is connected through the emitter and the collector of transistor 14 (14') causing transistor 13 (13') to turn OFF. Consequently, only transistor 14 (14') has to be switched ON or OFF by the magnitude of the input signal voltage $V_i$, and the conduction of transistor 13 (13') is controlled by the ON-OFF status of transistor 14 (14').

The base of transistor 14 (14') is connected to the emitter of transistor 16 (16') through diodes 22 (22') and 23 (23'), and the collector of transistor 16 (16') is connected to the high voltage power source $-V_H (+V_H)$ of opposite polarity through capacitor 172 (172'). The base of transistor 18 (18') is connected to the collector of transistor 16 (16') across resistor 171 (171'), and the collector of transistor 18 (18') is connected to transistor 14 (14') through diode 22 (22') as well as to resistor 192 (192') through diode 24 (24'). The emitter of transistor 18 (18') is connected to the high voltage power source $-V_H$ ($+V_H$) of opposite polarity. Diodes 22 (22'), 23 (23'), 24 (24'), 25 (25'), and 26 (26') act as reverse-current blocking diodes.

Now, in the case of this circuit, when the input signal voltage $V_i$ is lower than the voltage obtained by dividing the power source $V_L$ with resistors 191 and 192, transistor 16 turns OFF, and transistor 14 turns OFF. Consequently, transistor 13 turns ON and the input signal voltage $V_i$ is impressed on output transistor 1 and amplified, driving the load connected at OUT. When the input signal voltage $V_i$ increases and exceeds the bias voltage impressed on the base of transistor 16, transistor 16 turns ON and transistor 14 turns ON as a result of transistor 16 turning ON. The input signal voltage $V_i$ is impressed on output transistor 2 through transistor 14 and amplified, and the load is driven by output transistor 2. Concurrent with the change of transistor 14 to the ON-state, the above-mentioned transistor 13 turns OFF, and the impression of input signal voltage on output transistor 1 is blocked.

And, as a result of transistor 16 changing to its ON-state, capacitor 172 is charged by the collector current of transistor 16, the terminal voltage of capacitor 172 increases, and transistor 18 turns ON. Thus, even if the input signal voltage $V_i$ drops below the base voltage of transistor 16, transistor 18 maintains conduction for a fixed time determined by the discharge time constant of resistor 171 and capacitor 172. Consequently, as explained by the block diagram in FIG. 3, output transistor 2 continues to drive the load, and operates in the same manner as in the case of an ordinary class-B amplifier circuit is performed resulting in an improved distortion factor.

And, as a result of transistor 18 turning ON, the potential at the common junction of resistors 191 and 193 drops because current is drawn to the power source voltage $-V_H$ side through resistor 192, diode 24, and transistor 18, causing the base bias potential of transistor 16 to drop. Consequently, the value of input signal voltage $V_i$ necessary for turning transistor 16 OFF drops, and the comparison voltage of comparator 6 drops resulting in the same value as when comparator 6 possesses the desirable hysteresis characteristic. When the input signal voltage $V_i$ drops below the reduced base bias voltage of transistor 16, transistor 16 turns OFF, after which conduction of transistor 18 is maintained for a time determined by the same constant of resistor 171 and capacitor 172. After this time has elapsed, transistor 18 turns OFF and transistor 14 is switched OFF and transistor 13 is switched ON. As noted before, the operation is the same for the parts shown with primes except that they operate during the negative period of the signal impressed on the input terminal IN.

Consequently, the action in the case of the specific circuit shown in FIG. 4 is identical to the action explained with a block diagram in FIG. 3, with the result that the distortion factor is improved, and concurrently almost the same efficiency can be obtained as in the conventional voltage-switching amplifier shown in FIG. 1.

In the above explanation, both a time constant circuit as well as the holding circuit and positive feedback circuit were provided. However, by omitting the time constant circuit and using only the positive feedback circuit 9, 9' to provide hysteresis characteristics, that portion of deterioration in the distortion factor, due to fluctuations of comparator output in the case of the input voltage being near the comparison voltage is eliminated.

As explained above, with this invention, the same high efficiency is achieved as in a conventional amplifier circuit with a voltage-switching system and the distortion factor can be improved by either of two means. First, the installation of a device for providing a desirable hysteresis characteristic to the comparator, or by the installation of both a device for providing a desirable hysteresis characteristic to the comparator and a device for maintaining the conduction of the switching device that impresses the input signal voltage on the high voltage output transistor for a fixed time even though the input signal voltage or the output voltage drops below the comparison voltage after the input signal voltage or output voltage initially exceeds the comparison voltage.

It will be obvious to those of ordinary skill in the art in view of the above disclosure that many modifications and applications of the described invention are advantageous. For example, it could be utilized with a non-push-pull voltage-switching amplifier which may be desirable in some circumstances. Therefore, the above description is exemplary in nature and the present invention is limited only in accordance with the following claims.

What is claimed is:

1. An improved voltage-switching amplifier having an input supplied with an input signal and an output, said amplifier comprising:
   a low voltage amplifier;
   a high voltage amplifier, the output of which is higher in absolute value than the output of said low voltage amplifier; and
   means, responsive to one of said input signal and said output signal, for applying said input signal to one of said amplifiers, said applying means comprising:
      a comparator circuit for comparing said one of said signals to a comparison voltage and for providing an output indication of whether or not said one of said signals exceeds said comparison voltage in absolute magnitude;
      low voltage switch means responsive to said comparator circuit output indicating said one of said signals does not exceed said comparison voltage in absolute magnitude, for conducting said input signal to said low voltage amplifier;
      high voltage switch means responsive to said comparator circuit output indicating said one of said signals exceeds said comparison voltage in absolute magnitude, for conducting said input signal to said high voltage amplifier; and
      regulating means for reducing the absolute value of said comparison voltage in response to said input signal being conducted to said high voltage amplifier so that the input signal will continue to be conducted to the high voltage amplifier until said one of said signals drops below the reduced absolute value of the comparison voltage to thereby lessen high frequency distortion in said voltage-switching amplifier.

2. The voltage-switching amplifier according to claim 1, wherein said regulating means includes feedback circuit means, responsive to said comparator circuit output indicating said one of said signals exceeds said comparison voltage in absolute value, for reducing said comparison voltage.

3. The voltage-switching amplifier according to claim 1, wherein said regulating means includes time constant circuit means, responsive to said one of said signals, having exceeded said comparison voltage in absolute value, dropping below and remaining below said reduced comparison voltage for a predetermined period of time, for maintaining said high voltage switch means conducting for said predetermined period of time to thereby prevent momentary fluctuations in said input signal below the absolute value of said reduced comparison voltage from discontinuing the conduction of said input signal to the input signal to the high voltage amplifier.

4. The voltage-switching amplifier according to claim 3, wherein said time constant circuit means includes:

an RC time constant circuit, responsive to the comparator circuit output, for maintaining an output voltage for said predetermined period of time; and holding circuit means responsive to said RC time constant circuit output voltage, for maintaining said high voltage switch means in conduction.

* * * * *